United States Patent
Wang et al.

(10) Patent No.: US 11,878,388 B2
(45) Date of Patent: Jan. 23, 2024

(54) POLISHING PAD, POLISHING APPARATUS AND METHOD OF MANUFACTURING SEMICONDUCTOR PACKAGE USING THE SAME

(71) Applicant: Taiwan Semiconductor Manufacturing Co., Ltd., Hsinchu (TW)

(72) Inventors: Kuan-Cheng Wang, Miaoli County (TW); Ching-Hua Hsieh, Hsinchu (TW); Yi-Yang Lei, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 879 days.

(21) Appl. No.: 16/009,226

(22) Filed: Jun. 15, 2018

(65) Prior Publication Data

US 2019/0381630 A1 Dec. 19, 2019

(51) Int. Cl.
| | |
|---|---|
| *B24B 37/26* | (2012.01) |
| *B24B 37/16* | (2012.01) |
| *B24D 11/04* | (2006.01) |
| *B24B 37/22* | (2012.01) |
| *B24B 37/24* | (2012.01) |
| *B24B 7/22* | (2006.01) |
| *H01L 21/321* | (2006.01) |
| *H01L 23/00* | (2006.01) |
| *H01L 21/48* | (2006.01) |
| *H01L 21/687* | (2006.01) |
| *B24D 13/14* | (2006.01) |

(52) U.S. Cl.
CPC .............. *B24B 37/22* (2013.01); *B24B 7/228* (2013.01); *B24B 37/245* (2013.01); *B24B 37/26* (2013.01); *B24D 11/04* (2013.01); *B24D 13/142* (2013.01); *H01L 21/3212* (2013.01); *H01L 21/486* (2013.01); *H01L 21/68764* (2013.01); *H01L 24/08* (2013.01); *H01L 2224/02372* (2013.01)

(58) Field of Classification Search
CPC ......... B24B 7/228; B24B 37/16; B24B 37/22; B24B 37/245; B24B 37/26; B24D 11/04; B24D 13/142; H01L 21/3212; H01L 21/486; H01L 21/68764; H01L 24/08; H01L 2224/02372
USPC .......................................... 451/41, 527, 529
See application file for complete search history.

(56) References Cited

U.S. PATENT DOCUMENTS

| | | | | |
|---|---|---|---|---|
| 5,645,469 A | * | 7/1997 | Burke | ...................... B24B 37/26 451/283 |
| 5,725,420 A | * | 3/1998 | Torii | ....................... B24B 37/26 451/285 |
| 6,749,485 B1 | * | 6/2004 | James | ...................... B24B 13/04 451/41 |

(Continued)

FOREIGN PATENT DOCUMENTS

CN 102240966 * 11/2011 ............. B24B 47/10

*Primary Examiner* — Eileen P Morgan
(74) *Attorney, Agent, or Firm* — JCIPRNET

(57) ABSTRACT

A polishing pad, a polishing apparatus and a method of manufacturing a semiconductor package using the same are provided. In some embodiments, a polishing pad includes a sub-pad portion and a top pad portion over the sub-pad portion. The top pad portion includes a plurality of grooves having a first width and a plurality of openings having a second width different from the first width, and the openings are located in a center zone of the polishing pad.

20 Claims, 15 Drawing Sheets

(56) References Cited

U.S. PATENT DOCUMENTS

| | | | |
|---|---|---|---|
| 7,214,122 B2* | 5/2007 | Hirokawa | B24B 37/013 451/6 |
| 8,734,206 B2* | 5/2014 | Chang | B24B 41/06 451/285 |
| 9,180,570 B2* | 11/2015 | Kerprich | B24B 37/26 |
| 10,071,461 B2* | 9/2018 | Lehuu | B24B 37/245 |
| 2002/0019198 A1* | 2/2002 | Kamono | B24B 37/005 451/41 |
| 2004/0259479 A1* | 12/2004 | Sevilla | B23H 5/08 451/41 |
| 2005/0202761 A1* | 9/2005 | Rodriguez | B24B 37/26 451/56 |
| 2008/0003935 A1* | 1/2008 | Feng | B24B 37/26 451/527 |
| 2008/0220702 A1* | 9/2008 | Feng | B24B 37/26 451/527 |
| 2009/0258587 A1* | 10/2009 | Feng | B24B 37/26 451/527 |
| 2010/0105303 A1* | 4/2010 | Chiu | B24B 37/26 451/548 |
| 2012/0282849 A1* | 11/2012 | Kerprich | B24B 37/205 451/527 |
| 2013/0137350 A1* | 5/2013 | Allison | B24B 37/22 451/539 |
| 2014/0264839 A1* | 9/2014 | Tsai | H01L 23/49816 257/737 |
| 2014/0378035 A1* | 12/2014 | Noro | B24B 37/26 451/528 |
| 2015/0111476 A1* | 4/2015 | Tsai | B24B 37/26 451/59 |
| 2015/0133033 A1* | 5/2015 | Suen | B24B 37/005 451/73 |
| 2018/0161953 A1* | 6/2018 | Chen | B24B 37/24 |
| 2019/0160625 A1* | 5/2019 | Hu | B24B 37/005 |
| 2019/0164867 A1* | 5/2019 | Hu | H01L 24/09 |
| 2021/0028080 A1* | 1/2021 | Pietambaram | H01L 23/49503 |

* cited by examiner

POLISHING PAD, POLISHING APPARATUS AND METHOD OF MANUFACTURING SEMICONDUCTOR PACKAGE USING THE SAME

BACKGROUND

Polishing is one of the most common technology for thinning the dies of the semiconductor wafer and for planarizing the topography of the semiconductor packages. As many integrated circuits and electronic devices are manufactured from the semiconductor wafer, well controlled wafer thinning or package thinning is beneficial and valuable for the device performance and reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
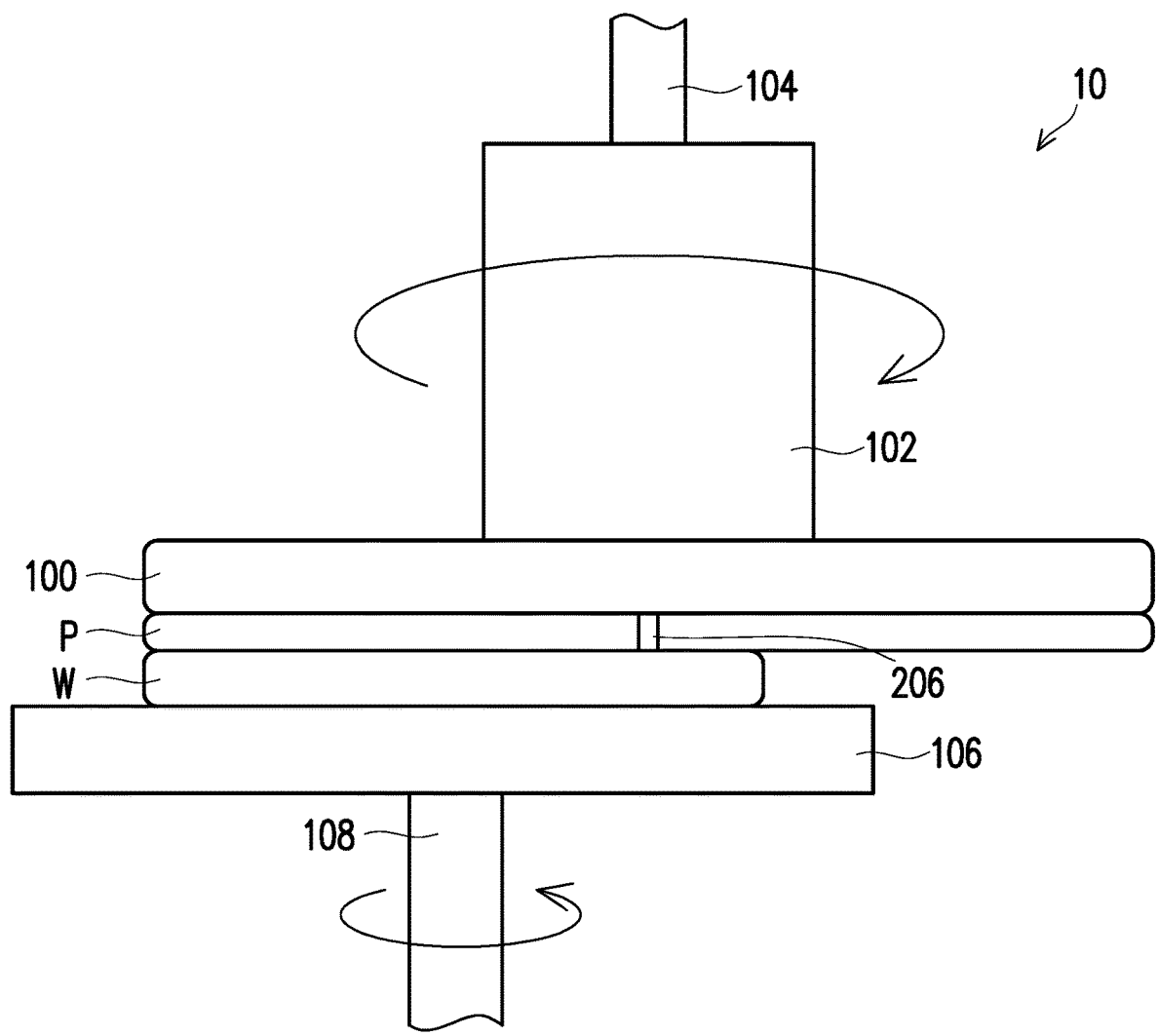
FIG. 1 is a schematic cross-sectional view illustrating a polishing apparatus in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view illustrating a polishing apparatus in accordance with some embodiments of the present disclosure.

The present disclosure relates to a polishing pad, a polishing apparatus and a method of manufacturing a semiconductor package using the same. In some embodiments, the polishing apparatus is a chemical mechanical polishing (CMP) apparatus that enables face-up wafer CMP processes. In some embodiments, in the face-up wafer processing/polishing, pressure and down force can be better controlled to reduce loss of wafer by damage and improve the polishing uniformity.

The apparatus and method of using the same are collectively described below. It is understood that additional steps can be provided before, during, and/or after the methods and some of the steps described below can be replaced or eliminated, for additional embodiments of the methods. It is further understood that additional features can be added in the apparatus and some of the features described below can be replaced or eliminated, for additional embodiments of the apparatuses.

Referring to FIG. 1, the polishing apparatus 10 may be used for processing a semiconductor wafer or semiconductor substrate. In some embodiments, the polishing apparatus includes a wafer chuck 106 and a polishing platen 100. The wafer chuck 106 is configured to hold a wafer W in a face-up orientation. The wafer W includes dies. In some embodiments, the wafer includes a silicon-containing wafer, a carrier with dies, or a workpiece to be polished. In some embodiments, a shaft 108 or a spindle is coupled to the wafer chuck 106, so as to control the rotation of the wafer chuck 106 and therefore the wafer W.

The polishing platen 100 opposes the wafer chuck 106, and a polishing pad P is attached to the polishing platen 100 and operable to contact the wafer W while the polishing pad P is rotating. In some embodiments, a shaft 102 or a spindle is coupled to the polishing platen 100, so as to control the rotation of the polishing platen 100 and therefore the polishing pad P. In some embodiments, a dimension of the polishing pad P is greater than a dimension of the wafer W. The dimension includes width, radius or area. In some embodiments, the polishing pad P is for polishing the top surface of wafer W. During the polishing process, the polishing pad P and the wafer W both rotate. In some embodiments, the polishing apparatus 10 further includes a control unit for controlling the polishing process, and for controlling the action of the polishing pad P. In some embodiments, the polishing pad P and the wafer W may rotate in opposite directions during polishing, as shown in FIG. 1. In alternative embodiments, the polishing pad P and the wafer W may rotate in the same direction during polishing. The polishing pad P and the wafer W may rotate at any speed, including high and low speeds.

In some embodiments, the polishing apparatus 10 further includes a slurry providing unit 104. The slurry providing unit 104 is configured to provide a slurry to the polishing pad P for polishing the wafer W. The slurry is generally known in the art as a liquid having suspended abrasive particles that is used for lapping, polishing and/or grinding the target surface of a target layer. In some embodiments, the polishing pad P has a slurry inlet 206 located in the center zone and penetrating through the polishing pad P, and the slurry provided by the slurry providing unit 104 flows to the wafer W through the slurry inlet 206.

Figure 2:
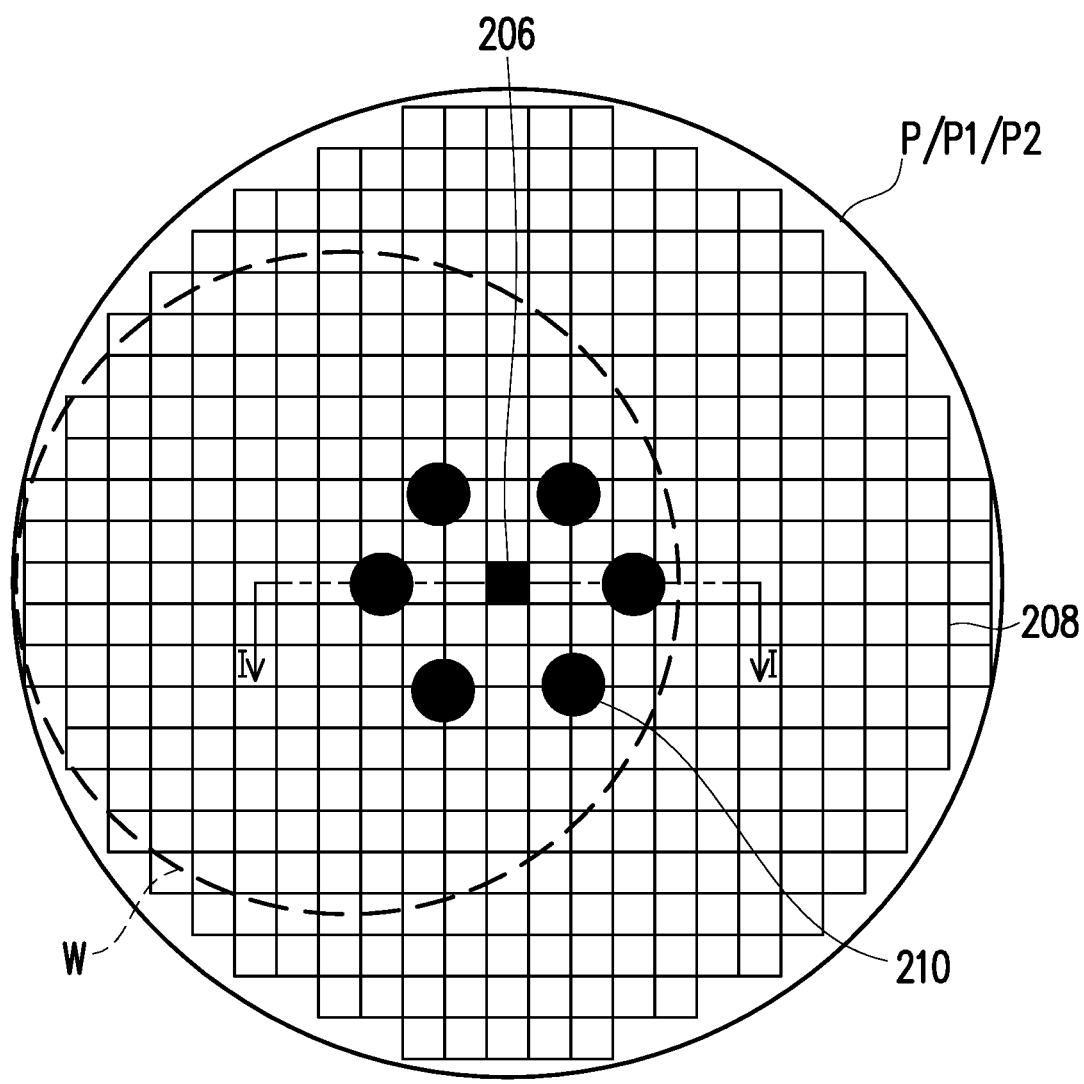
FIG. 2 is a top view of a polishing pad with respect to a wafer in accordance with some embodiments of the present disclosure.
Figure 3A:
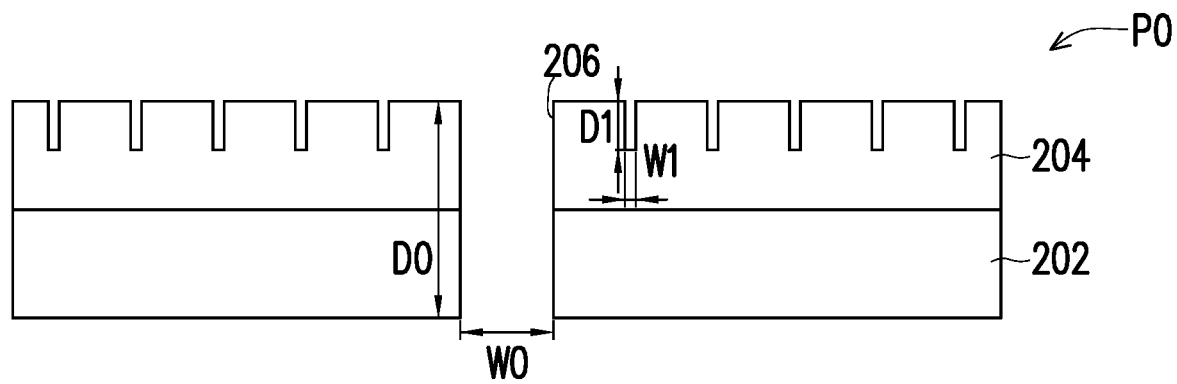
FIG. 3A to FIG. 3B are schematic cross-sectional view illustrating a method of forming a polishing pad in accordance with some embodiments of the present disclosure.
Figure 3B:
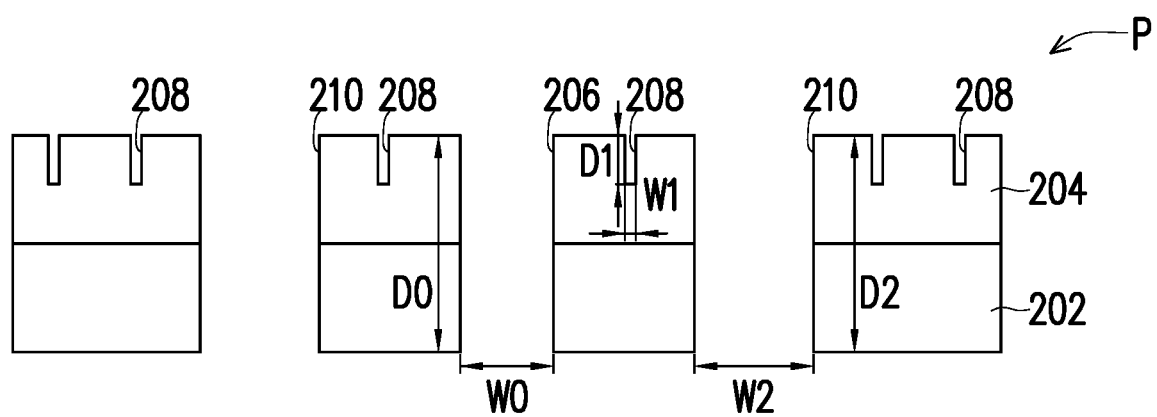
Figure 4:
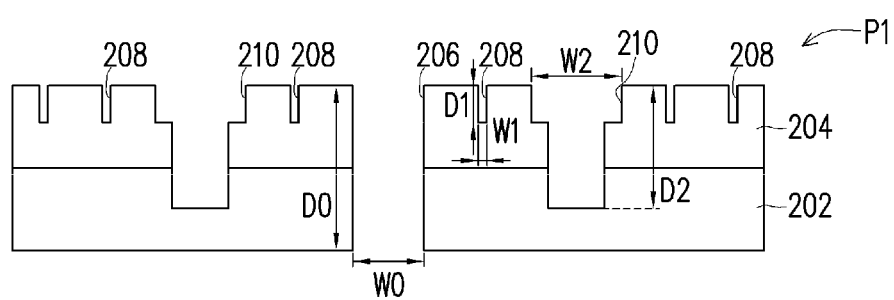
FIG. 4 to FIG. 5 are schematic cross-sectional views illustrating polishing pads in accordance with alternative embodiments of the present disclosure.
Figure 5:
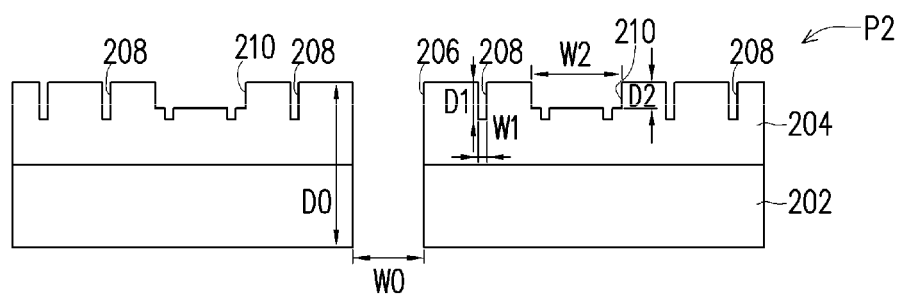

The structures and forming methods of the polishing pads of the present disclosure are illustrated below. FIG. 2 is a top view of a polishing pad with respect to a wafer in accordance with some embodiments of the present disclosure. FIG. 3A to FIG. 3B are schematic cross-sectional view illustrating a method of forming a polishing pad in accordance with some embodiments of the present disclosure. Specifically, FIG. 3B is the cross-sectional view of the polishing pad taken along the line I-I of FIG. 2. FIG. 4 to FIG. 5 are schematic cross-sectional views illustrating polishing pads in accordance with alternative embodiments of the present disclosure.

As shown in FIG. 2, the polishing pad P is off-centered with respect to the center of the wafer W. Specifically, the center of the polishing pad P and the center of the polishing pad P are lined up in the direction X but not overlapped. In some embodiments, an edge of the wafer W is aligned with an edge of the polishing pad P.

Referring to FIG. 3A, a polishing pad P0 is provided. The polishing pad P0 includes a sub-pad portion 202 and a top pad portion 204 over the sub-pad portion 202. Specifically, the sub-pad portion 202 is under the top pad portion 204 for mechanical support, and the sub-pad portion 202 is attached to the polishing platen 100. The top pad portion 204 is a porous polishing pad. The top pad portion 204 is provided with a grooved surface that aids mechanical polishing action and slurry distribution. The sub-pad portion 202 is a porous or non-porous polishing pad.

In some embodiments, the polishing pad can be formed from any suitable polymeric material including, but not limited to, polyamide, polyimide, nylon polymer, polyurethane, polyester, polypropylene, polyethylene, polystyrene, polycarbonate, diene containing polymer, such as AES, acrylic polymer, or a combination thereof. Embodiments of the present disclosure also contemplate the use of organic or inorganic materials that can be used as needed.

In some embodiments, the sub-pad portion 202 and the top pad portion 204 include the same material. In alternative embodiments, the sub-pad portion 202 includes a material different from that of the top pad portion 204.

In some embodiments, the polishing pad P0 has a slurry inlet 206 located in the center zone and penetrating through the sub-pad portion 202 and the top pad portion 204. The slurry inlet 206 can be formed using any suitable method including, but not limited to, machining by computer numerical controlled cutting, and the like. In some embodiments, the slurry inlet 206 is square, rectangular, polygonal, round, elliptical, strip-shaped, cross-shaped or an inlet with any suitable shape in a top view. For example, as shown in FIG. 2 and FIG. 3A, the slurry inlet 206 is a square-shaped inlet and has a width W0 and a depth D0.

In some embodiments, the top pad portion 204 of the polishing pad P0 further includes a plurality of grooves 208. The groove 208 can be formed using any suitable method including, but not limited to, machining by computer numerical controlled cutting, and the like. In some embodiments, the grooves 208 have any pattern including, but not limited to, linear grooves, arcuate grooves, annular concentric grooves, radial grooves, helical grooves, or other shapes that facilitate slurry flow across the polishing pad surface. For example, the grooves 208 include discontinuous radial lines, discontinuous concentric circles, discontinuous grid lines, continuous radial lines, continuous concentric circles, continuous grid lines, linear grooves, arcuate grooves, annular concentric grooves, radial grooves, helical grooves, intersecting X-Y patterns, intersecting triangular patterns, or combinations thereof. In some embodiments, as shown in FIG. 2 and FIG. 3A, the grooves 208 are grid lines and have a width W1 and a depth D1. In some embodiments, the width W1 of the grooves 208 is different from (e.g., less than) the width W0 of the slurry inlet 206.

In some embodiments, the grooves 208 are provided with similar shape and size, but the present disclosure is not limited thereto. In alternative embodiments, the grooves 208 are provided with different shapes and sizes as needed. For example, the depth D1 and the width W1 of a groove 208 can be different from the depth D1 and the width W1 of another groove 208.

Referring to FIG. 3B, a cutting process is performed to the polishing pad P0, so as to define a plurality of openings 210 therein. The openings 210 can be formed using any suitable method including, but not limited to, machining by computer numerical controlled cutting, and the like. In some embodiments, the openings 210 are square, rectangular, polygonal, round, elliptical, strip-shaped, cross-shaped or openings with any suitable shape in a top view. For example, as shown in FIG. 2 and FIG. 3B, the openings 210 are circular openings and have a width W2 and a depth D2.

In some embodiments, the openings 210 are provided with similar shape and size, but the present disclosure is not limited thereto. In alternative embodiments, the openings 210 are provided with different shapes and sizes as needed. For example, the depth D2 and the width W2 of an opening 210 can be different from the depth D2 and the width W2 of another opening 210.

Upon the cutting process of FIG. 3B, a polishing pad P is accordingly formed with grooves 208 and openings 210. In some embodiments, the grooves 208 are distributed uniformly while the openings 210 are distributed locally across the polishing pad P. In some embodiments, the grooves 208 have a dimension different from that of the openings 210, and the dimension includes width, depth, size or a combination thereof. The width W2 of the openings 210 may be different from the width W1 of the grooves 208. In some embodiments, the width W2 of the openings 210 is greater than the width W1 of the grooves 208, as shown in FIG. 3B. In alternative embodiments, the width W2 of the openings 210 can be equal to or less than the width W1 of the grooves 208. Besides, the depth D2 of the openings 210 may be different from the depth D1 of the grooves 208. In some embodiments, the depth D2 of the openings 210 is greater than from the depth D1 of the grooves 208, as shown in FIG. 3B. Specifically, the cutting process of FIG. 3B cuts through the polishing pad, so the openings 210 are formed through the sub-pad portion 202 and the top pad portion 204. However, the present disclosure is not limited thereto. In some embodiments, the cutting process of FIG. 3B does not cut through the polishing pad, so the openings 210 do not penetrate through the sub-pad portion 202 and the top pad portion 204, as shown in FIG. 4 and FIG. 5.

In some embodiments, as shown in FIG. 4, the cutting depth is greater than the depth D1 of the grooves 208, so the openings 210 of the polishing pad P1 are formed with a stepped sidewall and a flat bottom, and the openings 210 have a depth D2 (at the lowermost bottom thereof) greater than the depth D1 of the grooves 208.

In some embodiments, as shown in FIG. 5, the cutting depth is less than the depth D1 of the grooves 208, so the openings 210 of the polishing pad P2 are formed with a substantially vertical sidewall and an uneven bottom, and the openings 210 have a depth D2 (at the uppermost bottom thereof) less the depth D1 of the grooves 208.

The cross-sectional shapes of the openings 210 are not limited by the present disclosure. In some embodiments, some of the openings 210 have a stepped sidewall while some of the openings 210 have a substantially vertical sidewall. In some embodiments, some of the openings 210 have a flat bottoms while some of the openings 210 have an uneven bottom. The cross-sectional shapes of the openings 210 can be adjusted upon the process requirements.

Figure 6:
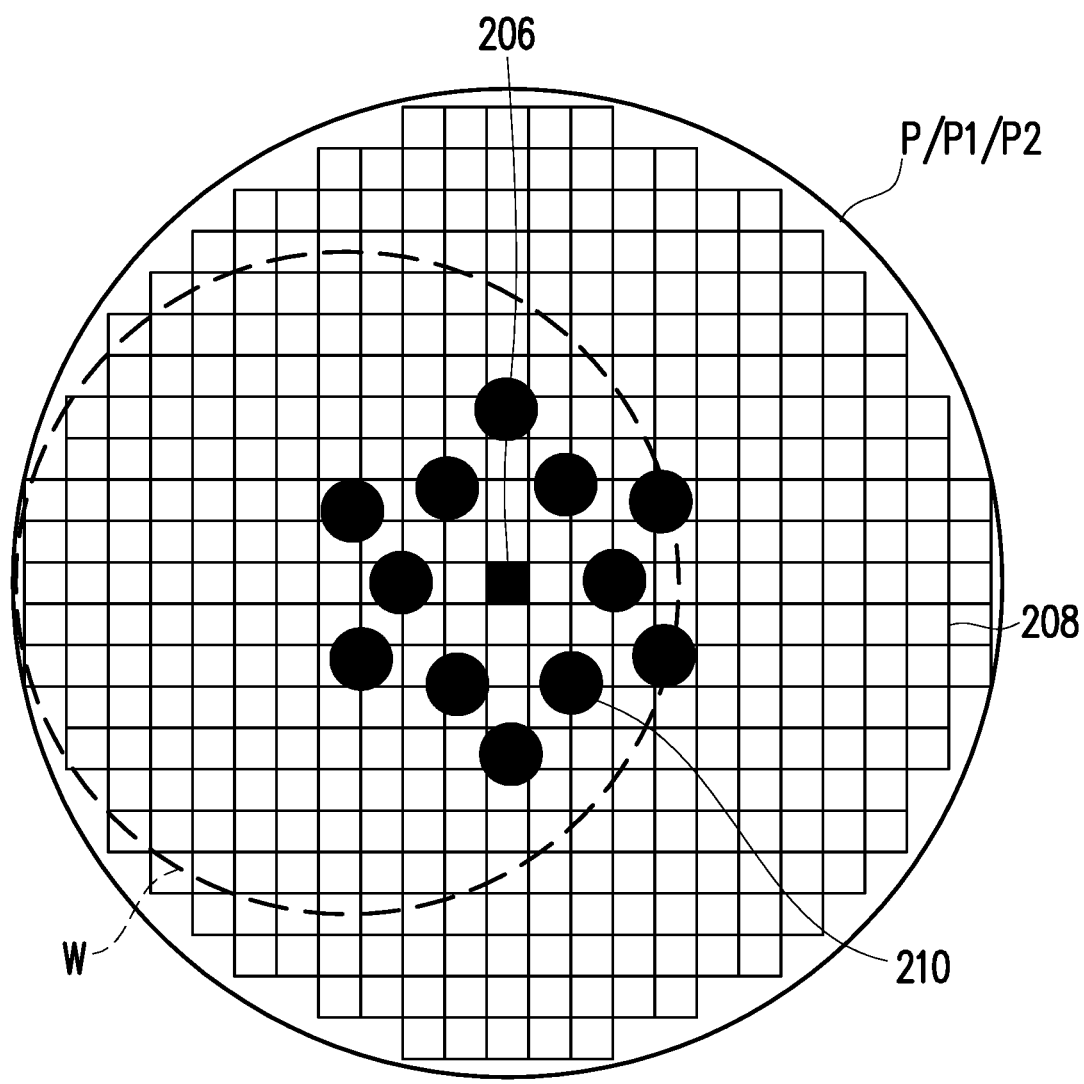
FIG. 6 to FIG. 8 are top views of various polishing pads with respect to wafers in accordance with alternative embodiments of the present disclosure.

The distributions and top-view shapes of the openings 210 are described below with reference to FIG. 2 and FIG. 6 to FIG. 8. In some embodiments, the openings 210 are located in a center zone of the polishing pad P/P1/P2. In some embodiments, the openings 210 are not located in an edge zone of the polishing pad P/P1/P2. Specifically, the openings 210 are located around the slurry inlet 206. In some embodiments, the openings 210 are distributed symmetrically with respect to the slurry inlet 206, as shown in FIG. 2, FIG. 6 and FIG. 8. In some embodiments, the openings 210 are distributed asymmetrically with respect to the slurry inlet 206, as shown in FIG. 7.

As shown in FIG. 2 and FIG. 6 to FIG. 8, the polishing pad P/P1/P2 is off-centered with respect to the center of the wafer W. In some embodiments, as shown in FIG. 1 and FIG. 6 to FIG. 8, from a top view, the openings 210 of the polishing pad P/P1/P2 are positioned over and substantially correspond to the wafer W during the polishing, wherein a diameter of the wafer W is greater than a radius of the polishing pad P/P1/P2.

In some embodiments, the openings 210 of the polishing pad P/P1/P2 are overlapped with the wafer W during polishing, as shown in FIG. 2. In alternative embodiments, the openings 210 of the polishing pad P/P1/P2 are partially overlapped with the wafer W during polishing. Specifically, most parts of the openings 210 of the polishing pad P/P1/P2 are overlapped with the wafer W during polishing, while few parts of the openings 210 of the polishing pad P/P1/P2 are not overlapped with the wafer W during polishing, as shown in FIG. 6 to FIG. 8.

Figure 7:
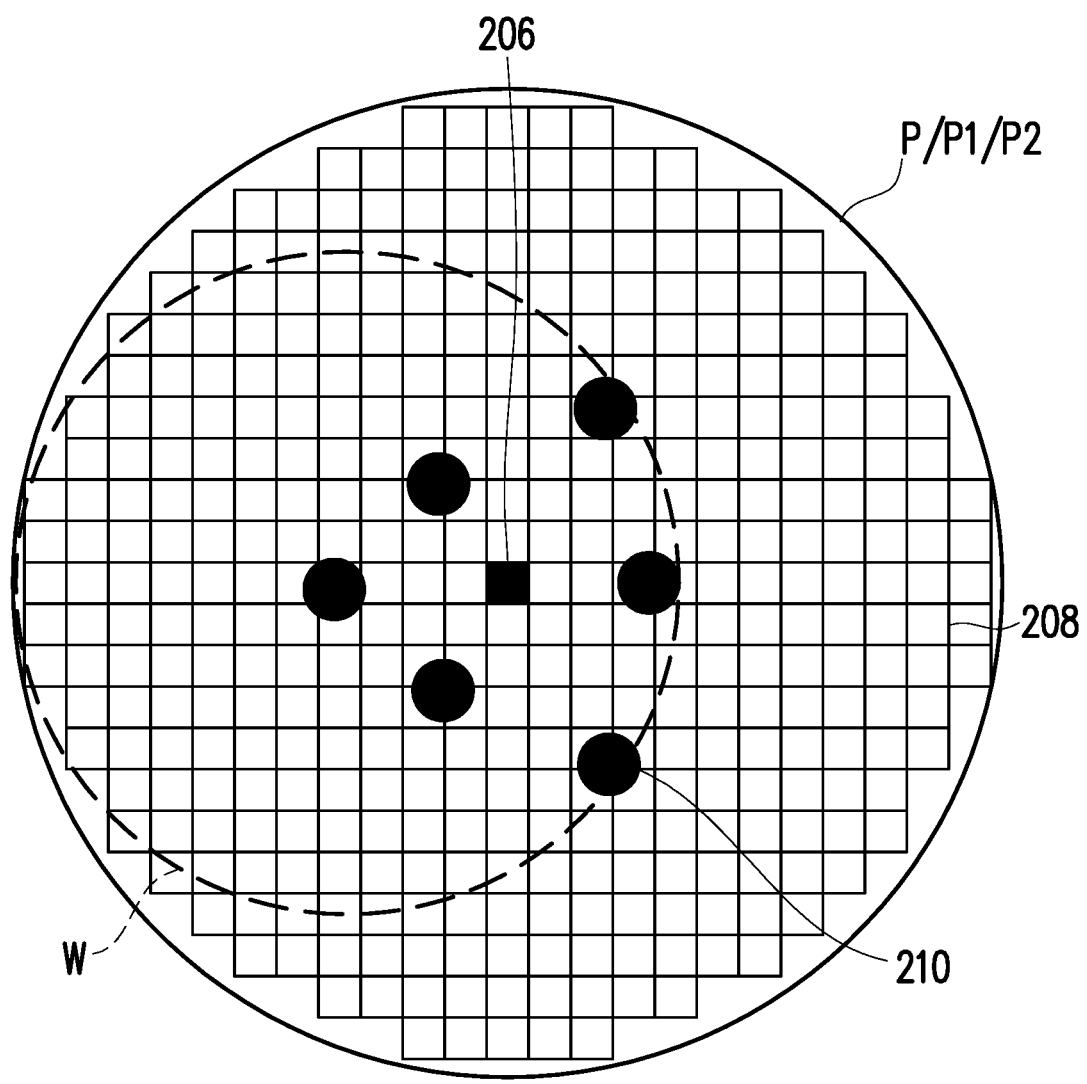
Figure 8:
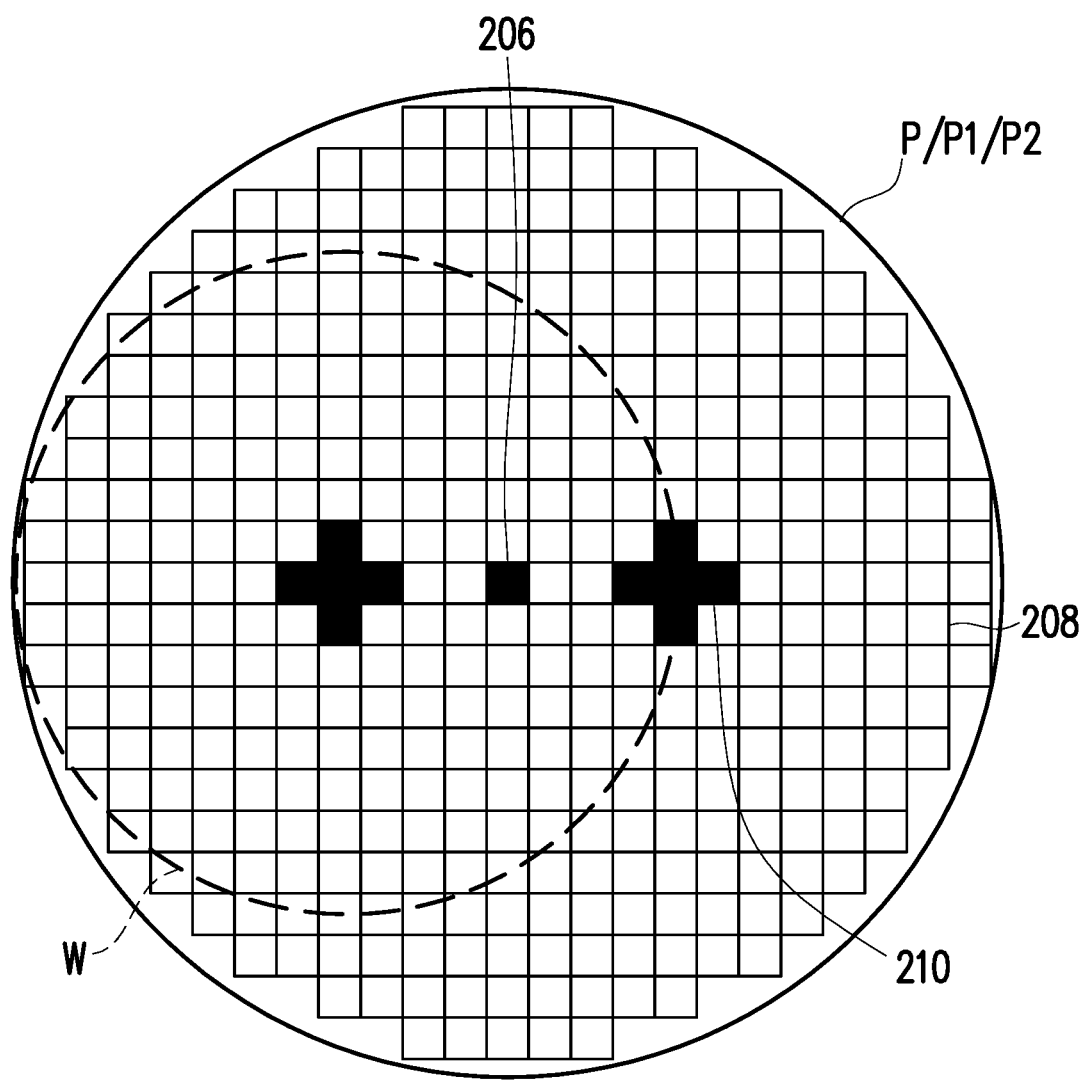
Figure 9:
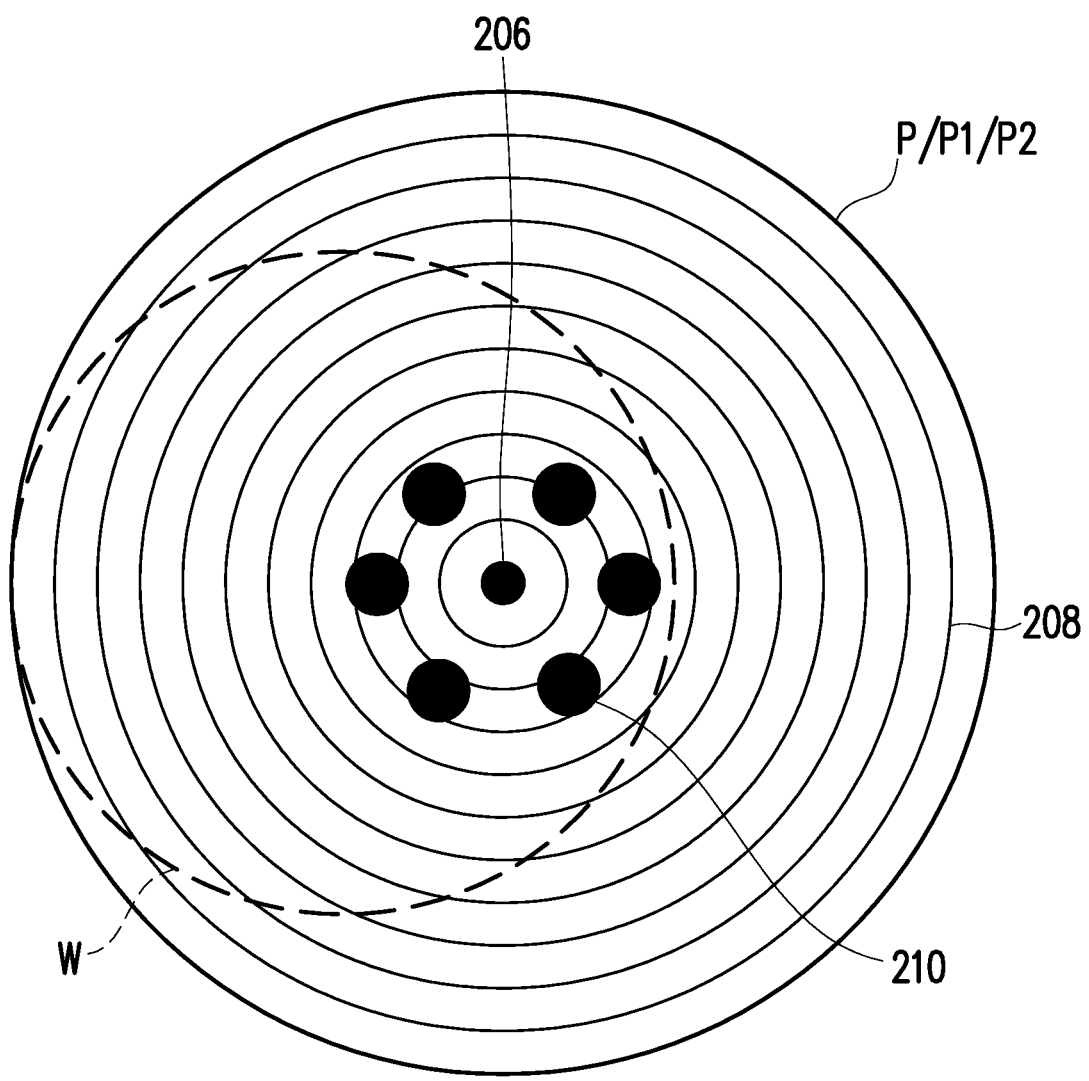
FIG. 9 to FIG. 12 are top views of various polishing pads with respect to wafers in accordance with yet alternative embodiments of the present disclosure.
Figure 10:
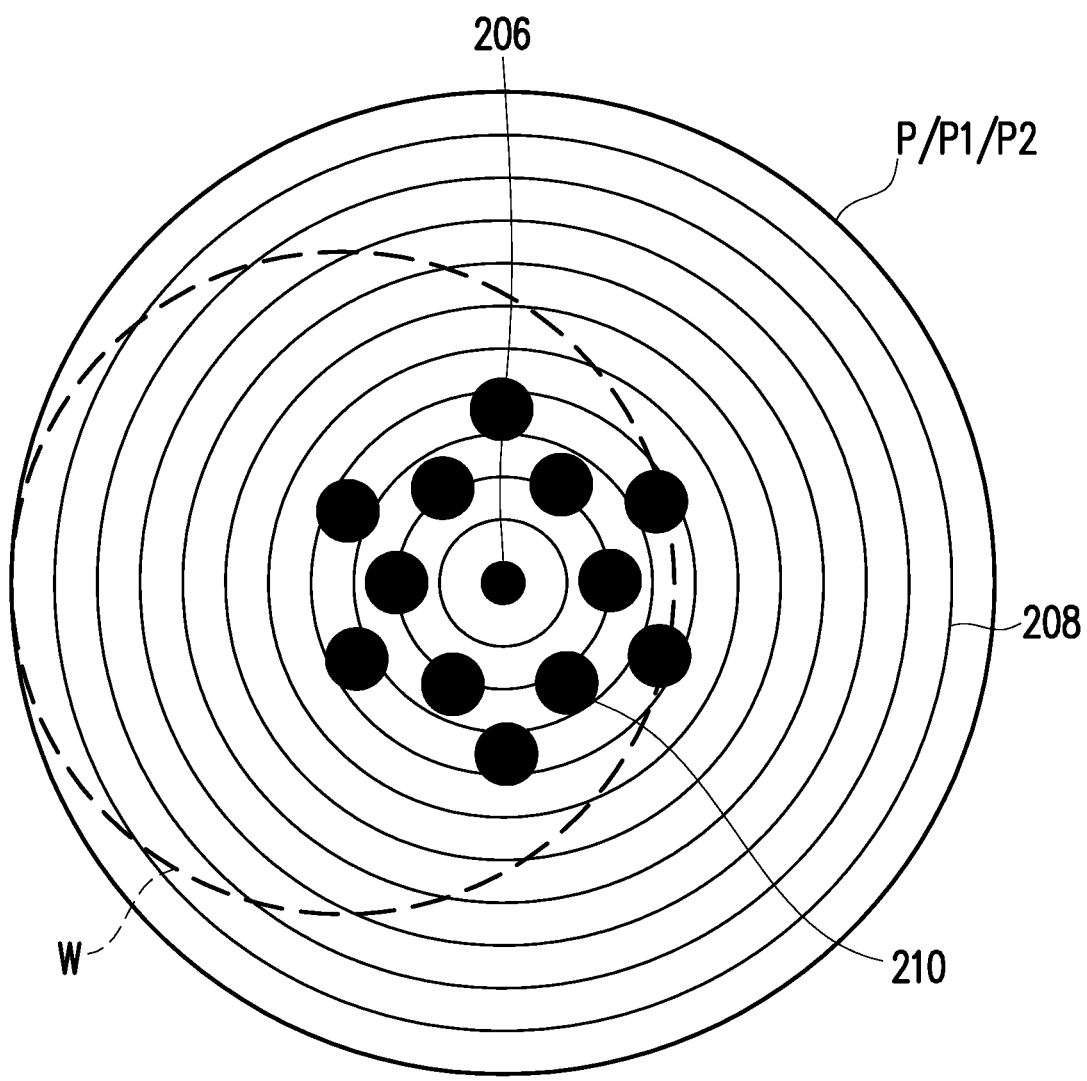
Figure 11:
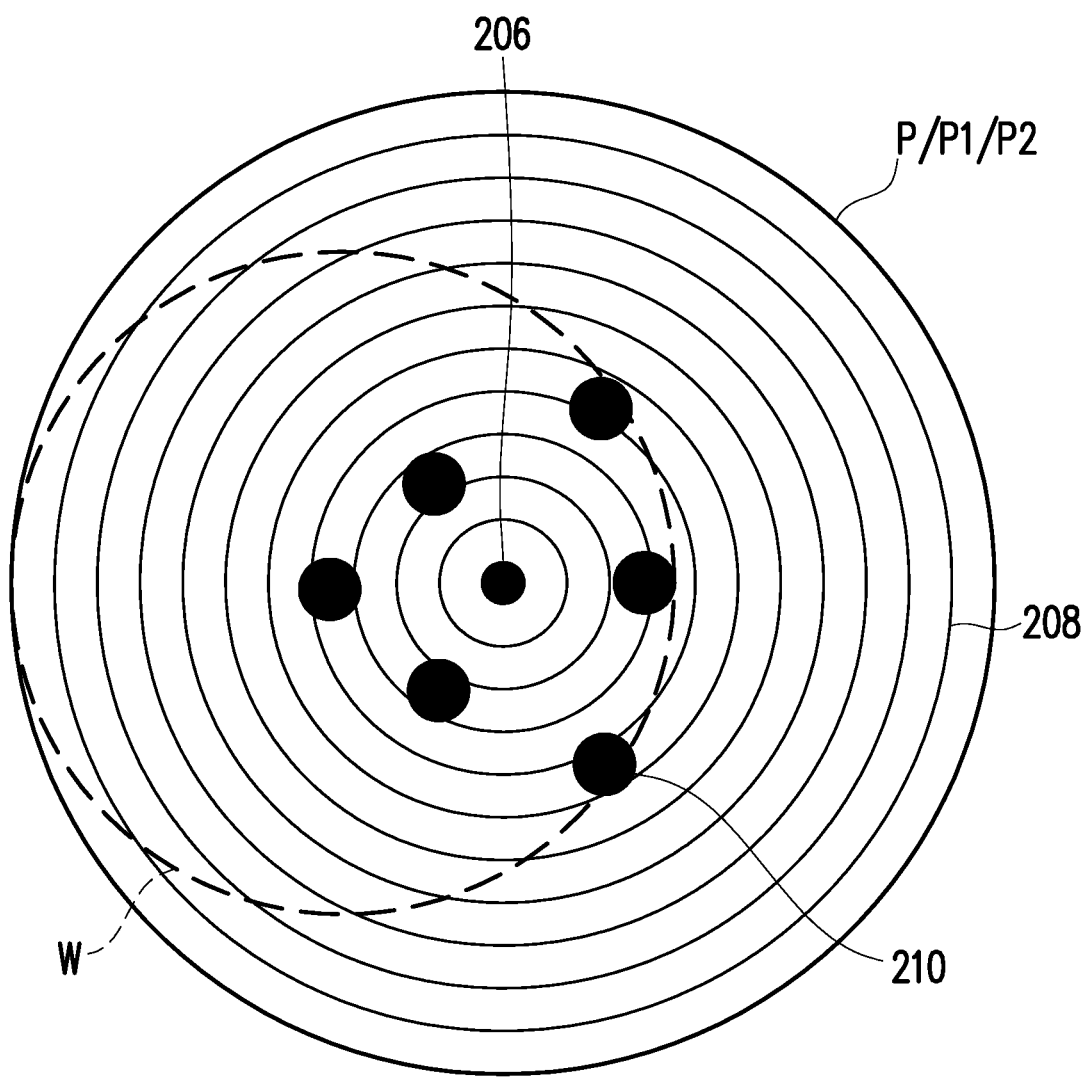
Figure 12:
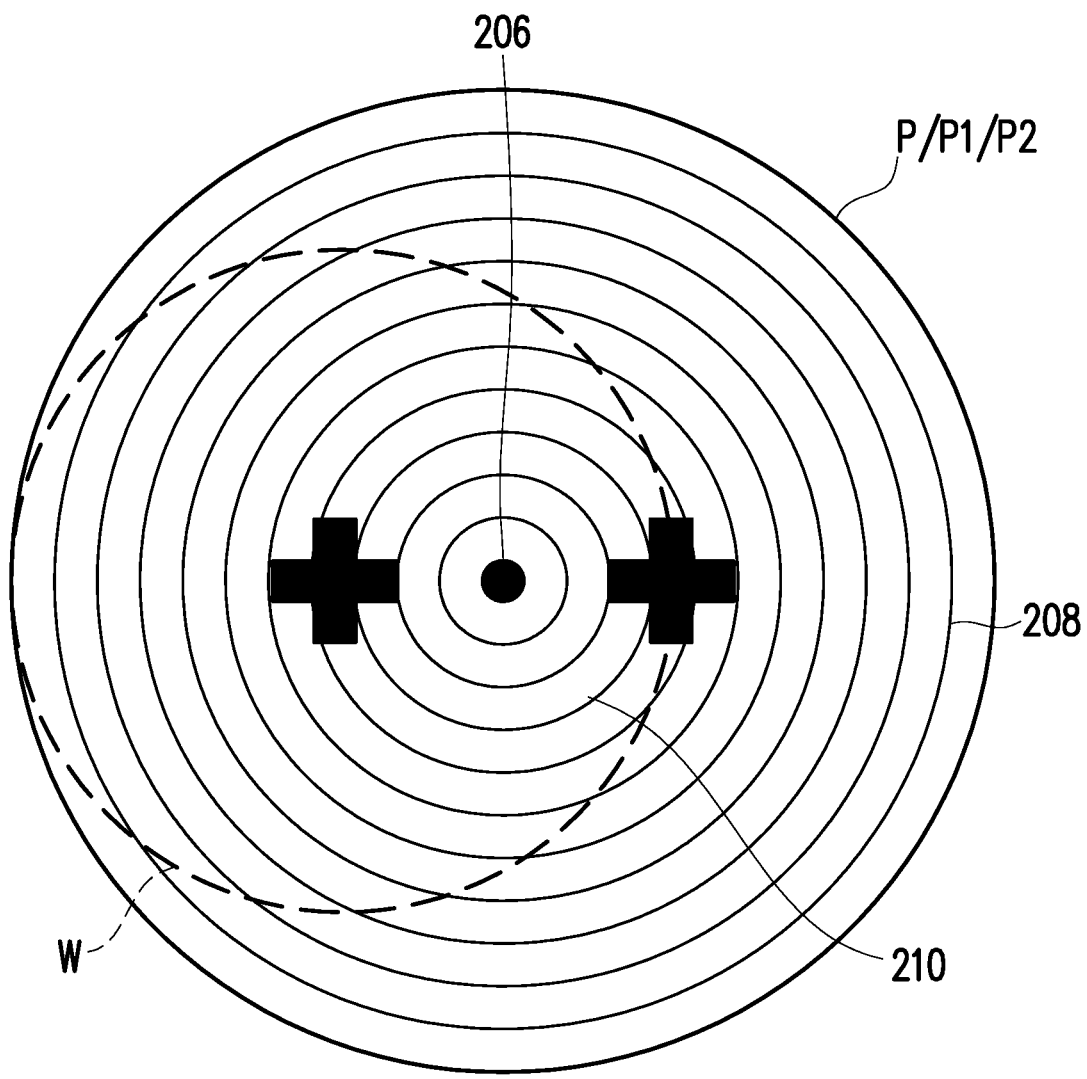

In some embodiments, the openings 210 are round, as shown in FIG. 2 and FIGS. 6-7. In alternative embodiments, the openings 210 are cross-shaped, as shown in FIG. 8. The shapes of the openings are not limited by the present disclosure. For example, the openings 210 can be square, rectangular, polygonal, elliptical, strip-shaped or openings with any suitable shape.

In the present disclosure, the openings 210 are located around the slurry inlet 206 of the polishing pad P/P1/P2, and the polishing pad P/P1/P2 and the wafer W are arranged in an off-centered manner. By such disposition, the slurry can be delivered to the entire wafer polishing location, problems such as a poor polishing profile (non-uniformity) within a wafer and wafer-to-wafer polishing inconsistencies can be avoided. In some embodiments, the edge polishing rate of the wafer can be improved and the polishing uniformity within the wafer can be accordingly improved. Besides, the distributions, sizes and shapes of the openings 210 can be adjusted as needed, so as to change the resulting polishing profile (e.g., a smile profile, a cry profile, or a profile with two rounded peaks, two pointed peak or one rounded peak) to meet the customers' requirements.

FIG. 9 to FIG. 12 are top views of various polishing pads with respect to wafers in accordance with yet alternative embodiments of the present disclosure.

The polishing pads of FIG. 9 to FIG. 12 are similar to the polishing pads of FIG. 2 and FIGS. 6-8, and the difference lies in the groove patterns. Specifically, the grooves of the polishing pads of FIG. 9 to FIG. 12 are concentric grooves while the grooves of the polishing pads of FIG. 9 to FIG. 12 are grid-like grooves. The shapes of the grooves are not limited by the present disclosure. For example, the grooves 208 can be linear grooves, arcuate grooves, radial grooves, helical grooves, or grooves with any suitable shape.

In some embodiments, the polishing pad may be applicable for any suitable structure including a semiconductor wafer, a die and a package structure. For thinning or polishing a wafer or an intermediate wafer-level package structure, silicon, semiconductor compound materials, metal or metallic materials, and/or encapsulating or molding materials may be removed or polished by the polishing pad of the present disclosure during a polishing process. The polishing process may include a coarse polishing process, a fine polishing process or both.

FIG. 13A to FIG. 13F are schematic cross-sectional views of various stages in a manufacturing process of a semiconductor package in accordance with some embodiments of the present disclosure.

Figure 13A:
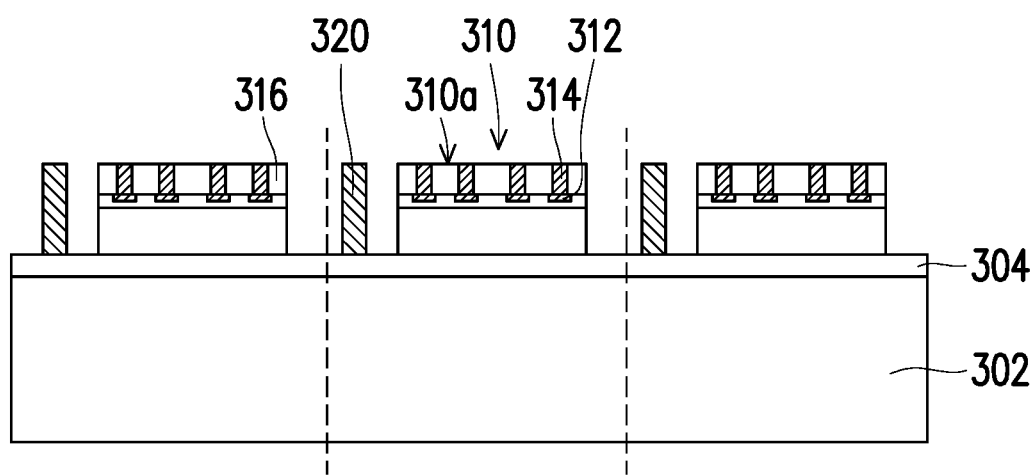
FIG. 13A to FIG. 13F are schematic cross-sectional views of various stages in a manufacturing process of a semiconductor package in accordance with some embodiments of the present disclosure.

Referring to FIG. 13A, in some embodiments, a carrier 302 with a buffer layer 304 coated thereon is provided, the carrier 302 may be a glass carrier or any suitable carrier for carrying a semiconductor wafer or a reconstituted wafer for the manufacturing method of the semiconductor package. In some embodiments, the buffer layer 304 includes a debond layer and the debond layer may include, for example, a light-to-heat conversion ("LTHC") layer. In some embodiments, the buffer layer 304 includes an adhesive layer or a die attach film.

Continue referring to FIG. 13A, in some embodiments, through vias 320 are formed on the buffer layer 304 over the carrier 302. In some embodiments, the through vias 320 are through integrated fan-out vias ("TIVs"). In some embodiments, the through vias 320 include copper, nickel, titanium, a combination thereof, or the like, and are formed by photolithography, plating, and photoresist stripping processes.

Besides, one or more dies 310 are provided and placed on the buffer layer 304 over the carrier 302. In exemplary embodiments, the dies 310 may include the same type of chips or different types of chips, and may be digital chips, analog chips or mixed signal chips, such as disclosure-specific integrated circuit ("ASIC") chips, sensor chips, wireless and radio frequency chips, memory chips, logic chips or voltage regulator chips. In some embodiments, each die 310 includes pads 312 on the active surface 310a and metal posts 314 located on the pads 312. In exemplary embodiments, the pads 312 are aluminum contact pads. In one embodiment, the metal posts 314 are copper posts or copper alloy posts. In certain embodiment, the die 310 is pre-molded and the metal posts 314 located on the pads 312 of the die 310 are covered by a dielectric material 316. In some embodiments, the buffer layer 304 includes the die attach film and the backsides of the dies 310 are adhered to the buffer layer 304 on the carrier 302, while the active surface 310a of the die 310 faces upward. In alternative embodiments, before placing the dies 310 on the carrier 302, the metal posts 314 on the dies 310 are uncovered (i.e. bare dies not molded or encapsulated) and a die attach film may be attached to the backside of the die 310.

In some embodiments, the dies 310 are placed over the carrier 302 and arranged aside the through vias 320. In some embodiments, the through vias 320 are formed before the placement of the dies 310. In alternative embodiments, the through vias 320 are formed after the placement of the dies 310. In some embodiments, as shown in FIG. 13A, the dotted line represents the cutting line of the whole package in the subsequent cutting process and some of the through vias 320 are arranged close to but not on the cutting line, and are arranged around the dies 310.

Figure 13B:
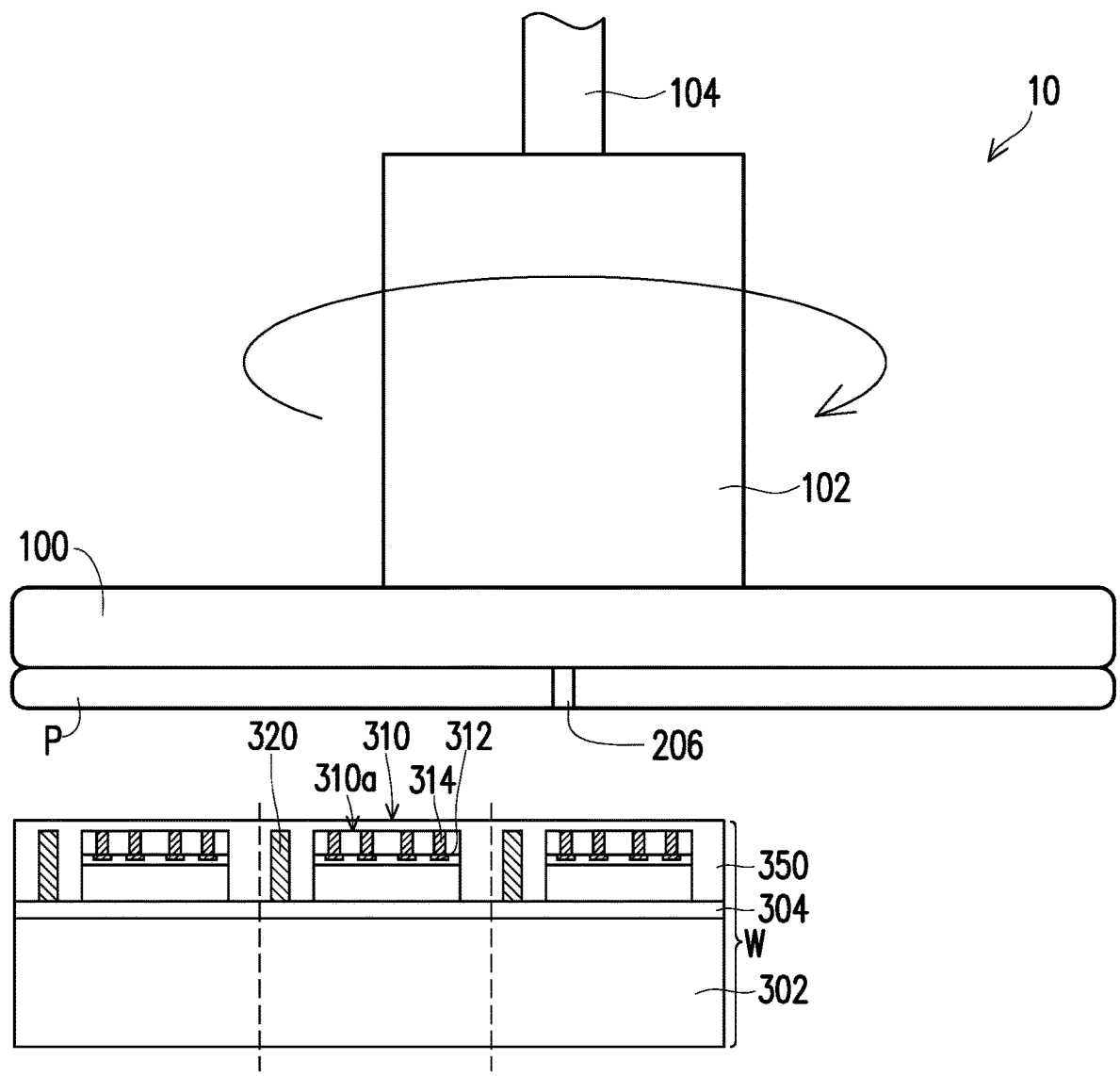

Referring to FIG. 13B, in some embodiments, a molding compound 350 is formed over the carrier 302 and encapsulates the dies 310 and the through vias 320. In some embodiments, the molding compound 350 covers the buffer layer 304 and fills between the dies 310 and the through vias 320. In certain embodiments, the molding compound 350 fully covers the through vias 320 and the dies 310. In some embodiments, the molding compound 350 over-molds the dies 310 and the through vias 320 with a height exceeding the height/thickness of the dies 310 and the through vias 320. In one embodiment, the material of the molding compound 350 includes at least one type of resins selected from epoxy resins, phenolic resins and silicon-containing resins.

Figure 13C:
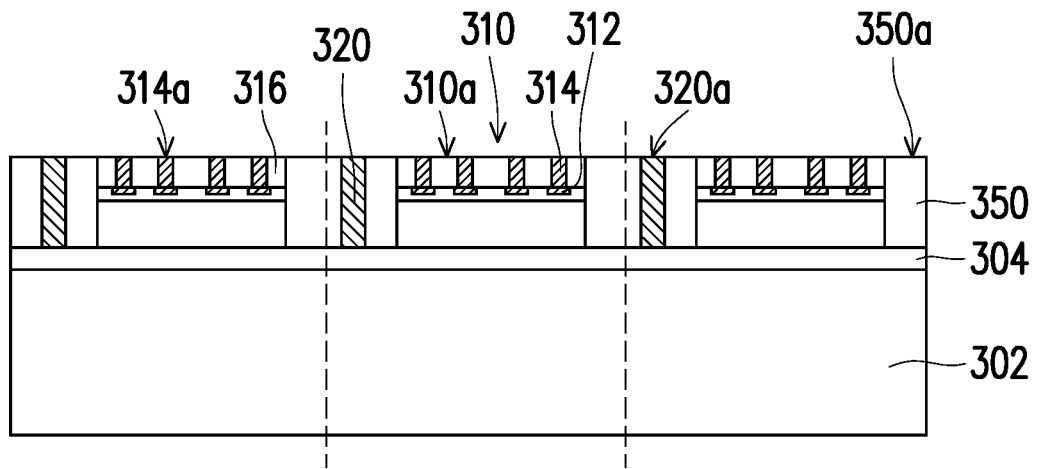

Referring to FIG. 13B and FIG. 13C, in some embodiments, a polishing process is performed to the molding compound 350 to reduce the height of the molding compound 350, thus exposing the metal posts 314 of the dies 310 and the through vias 320. In certain embodiments, during the polishing, the metal posts 314, the through vias 320 and the molding compound 350 become flattened and substantially levelled. In alternative embodiments, after polishing, the top surface 350a of the molding compound 350 may be substantially levelled with the top surfaces 320a of the through vias 320 and top surfaces 314a of the metal posts 314 of the die 310. In some embodiments, the polishing process is performed using the polishing pad P of the polishing apparatus 10 of the present disclosure. The polishing pad P can be one of the polishing pads as shown in FIG. 3B to FIG. 12. In some embodiments, as shown in FIG. 12 and FIG. 6 to FIG. 8, from a top view, the polishing pad P includes a plurality of grooves and a plurality of openings, and the openings of the polishing pad P are positioned over and substantially correspond to the wafer W during polishing. In some embodiments, the grooves are distributed uniformly while the openings are distributed locally across the polishing pad P. In some embodiments, the grooves have a dimension different from that of the openings, and the dimension includes width, depth, size or a combination thereof. In some embodiments, the grooves have a shape different from that of the openings.

In some embodiments, after polishing the molding compound 350 with the polishing process using the polishing pad of the present disclosure, well-controlled and better surface smoothness and flatness of the molding compound 350 is achievable. In some embodiments, the polishing rate uniformity or reduced rate uniformity (RR U %) of the molding compound is improved from 20% to 5% or less. In certain embodiments, especially for the polishing process performed toward the molding compound 350 and the TIVs (and/or metal posts 314) embedded within the molding compound 350, small surface roughness values are attained. Improved surface smoothness and flatness of the package structure can be achieved by applying the disclosed polishing process using the polishing pad of the present disclosure. In certain embodiments, little or no pits are generated on the surface(s) of the polished structure (e.g. the TIVs and the molding compound), resulting in small surface roughness and better surface evenness.

Figure 13D:
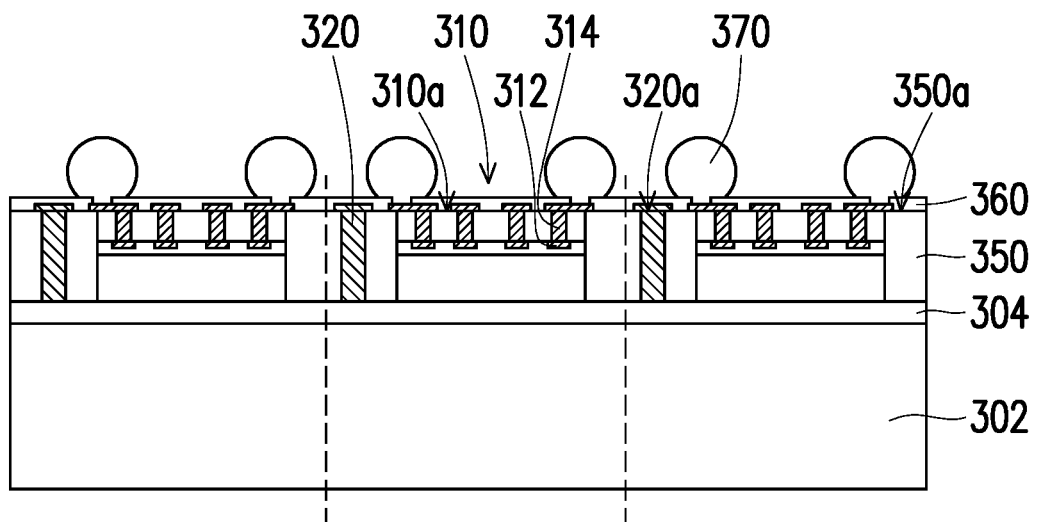

Referring to FIG. 13D, in some embodiments, a redistribution layer 360 is formed on the molding compound 350, over the metal posts 314 of the dies 310 and on the through vias 320. In some embodiment, the redistribution layer 360 is electrically connected to the through vias 320 and the metal posts 314 of the dies 310. In certain embodiments, the formation of the redistribution layer 360 includes sequentially forming one or more dielectric material layers and one or more metallization layers in alternation, and the metallization layer(s) may be sandwiched between the dielectric material layer(s). In some embodiments, the material of the metallization layer(s) includes aluminum, titanium, copper, nickel, tungsten, silver and/or alloys thereof. In some embodiments, the material of the dielectric material layer(s) includes polyimide, benzocyclobutene, or polybenzooxazole. In some embodiments, the redistribution layer 360 is a front-side redistribution layer electrically connected to the dies 310 and is electrically connected to the through vias 320. In certain embodiments, as the underlying molding compound 350 provides better planarization and evenness, the later-formed redistribution layer 360, especially the metallization layer with thin line width or tight spacing, can be formed with uniform line-widths and/or improved line/wiring reliability.

Continue referring to FIG. 13D, in some embodiments, the conductive elements 370 are mounted on the redistribution layer 360 and are electrically connected to the redistribution layer 360. In some embodiments, prior to disposing the conductive elements 370, flux may be applied for better attachment. In some embodiments, the conductive elements 370 are, for example, solder balls or ball grid array ("BGA") balls placed on the redistribution layer 360. In some embodiments, some of the conductive elements 370 are electrically connected to the dies 310 through the redistribution layer 360, and some of the conductive elements 370 are electrically connected to the through vias 320.

Figure 13E:
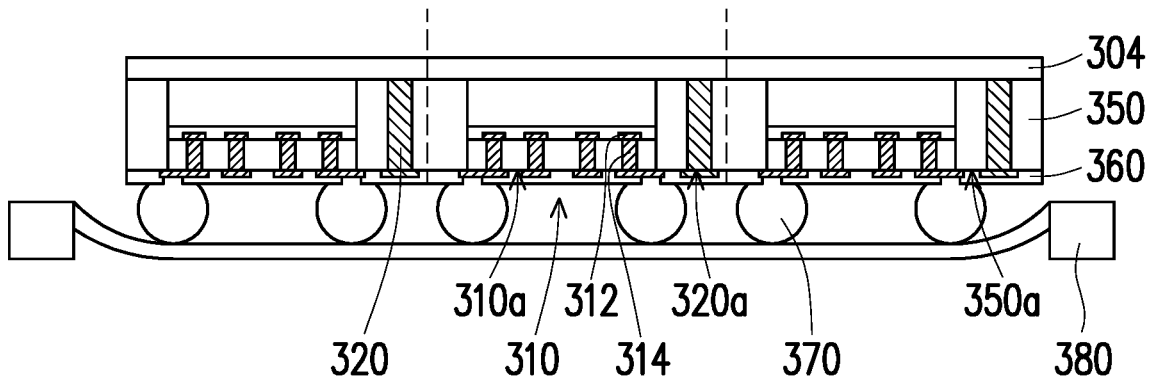

Referring to FIG. 13E, in some embodiments, the whole package is turned upside down and disposed on a carrier film 380. In some embodiments, the whole package is debonded from the carrier 302 to separate the dies 310 from the carrier 302. In some embodiments, after debonding from the carrier 302, the buffer layer 304 is exposed and remains on the molding compound 350 and the dies 310. In some embodiments, after debonding from the carrier 302, the buffer layer 304 is removed through an etching process or a cleaning process.

Figure 13F:
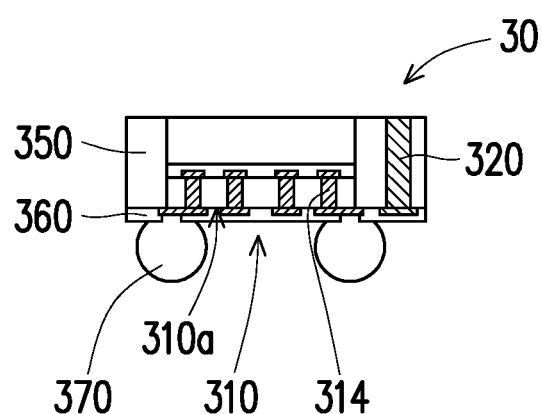

Referring to FIG. 13F, in some embodiments, a dicing process is performed to cut the whole package structure (at least cutting though the molding compound 350 and the redistribution layer 360) along the cutting line (the dotted line) into individual and separated semiconductor packages 30. In one embodiment, the dicing process is a wafer dicing process including mechanical blade sawing or laser cutting.

The above embodiment in which the polishing pad of the present disclosure is applied to polish the molding compound of an integrated fan-out package, and is not construed as limiting the present disclosure. In some embodiments, the polishing pad of the present disclosure can be applied to polish a target layer of an integrated fan-in package, a FinFET device or a planar device. The target layer includes silicon, polymer, metal or a material to be polished.

Many variations of the above examples are contemplated by the present disclosure. It is understood that different embodiments may have different advantages, and that no particular advantage is necessarily required of all embodiments.

In accordance with some embodiments of the present disclosure, a polishing pad includes a sub-pad portion and a top pad portion over the sub-pad portion. The top pad portion includes a plurality of grooves having a first width and a plurality of openings having a second width different from the first width, and the openings are located in a center zone of the polishing pad.

In accordance with alternative embodiments of the present disclosure, a polishing apparatus includes a wafer chuck, a polishing platen and a slurry providing unit. The wafer chuck is configured to hold a wafer in a face-up orientation. The polishing platen opposes the wafer chuck, wherein a polishing pad is attached to the polishing platen and operable to contact the wafer while the polishing pad is rotating, and wherein the polishing pad includes a plurality of grooves and a plurality of openings, and the grooves are distributed uniformly while the openings are distributed locally across the polishing pad. The slurry providing unit is configured to provide a slurry to the polishing pad for polishing the wafer.

In accordance with yet alternative embodiments of the present disclosure, a method of manufacturing a semiconductor package includes the following operations. A carrier is provided. Through vias are formed on the carrier and dies are placed on the carrier. A molding compound is formed to encapsulate the dies and the through vias. The molding compound is polished using a polishing pad, so as to expose the through vias, wherein the polishing pad includes a plurality of grooves and a plurality of openings, and the openings substantially correspond to a half part of the carrier during polishing. A redistribution layer is formed on the molding compound and on the dies, wherein the redistribution layer is electrically connected to the through vias and the dies. Conductive elements are mounted on the redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor package, comprising:
   placing a die on a carrier;
   forming a material layer over the die; and
   polishing the material layer using a polishing pad, so as to reduce a height of the material layer, wherein the polishing pad comprises a plurality of grooves having a first width and a plurality of openings having a second width greater than the first width, and the plurality of openings are distributed asymmetrically with respect to a center point of the polishing pad,
   wherein the grooves are intersecting X-Y patterns of continuous grooves, and some of the openings intersect at least three of the continuous grooves, and
   wherein the openings penetrate through the polishing pad, while the grooves do not penetrate through the polishing pad.

2. The method of claim 1, wherein from a top view, the carrier and the polishing pad are relatively rotated in an off-centered manner during the polishing, wherein a diameter of the carrier is greater than a radius of the polishing pad.

3. The method of claim 1, wherein the material layer comprises a molding compound.

4. The method of claim 1, wherein each of the openings of the polishing pad has a substantially vertical sidewall.

5. The method of claim 1, wherein at least one of the openings has a stepped sidewall.

6. A method of manufacturing a semiconductor package, comprising:
   forming a material layer over a carrier; and
   polishing the material layer using a polishing pad, wherein the polishing pad comprises a plurality of grooves and a plurality of openings, and the grooves are distributed uniformly across the polishing pad while the openings are distributed locally across the polishing pad,
   wherein during the polishing, the plurality of openings of the polishing pad are overlapped with the carrier,
   wherein the grooves are intersecting X-Y patterns of continuous grooves, and some of the openings intersect at least three of the continuous grooves, and
   wherein the openings penetrate through the polishing pad, while the grooves do not penetrate through the polishing pad.

7. The method of claim 6, wherein the carrier has a die formed thereon, and the material layer covers the die.

8. The method of claim 6, wherein from a top view, the carrier and the polishing pad are relatively rotated in an off-centered manner, wherein a diameter of the carrier is greater than a radius of the polishing pad.

9. The method of claim 6, wherein at least one of the openings has a stepped sidewall.

10. The method of claim 6, wherein the material layer comprises a molding compound.

11. The method of claim 6, wherein each of the openings of the polishing pad has a substantially vertical sidewall.

12. The method of claim 6, wherein the openings are square, rectangular, polygonal, round, elliptical, strip-shaped or cross-shaped.

13. A method of manufacturing a semiconductor package, comprising:
   forming a material layer over a carrier; and
   polishing the material layer using a polishing pad, so as to reduce a height of the material layer, wherein the polishing pad comprises a plurality of grooves having a first width and a plurality of openings having a second width greater than the first width, and the plurality of openings are distributed asymmetrically with respect to a center point of the polishing pad,
   wherein from a top view, the plurality of openings of the polishing pad are positioned over the carrier during the polishing, wherein a diameter of the carrier is greater than a radius of the polishing pad,
   wherein the grooves are intersecting X-Y patterns of continuous grooves, and some of the openings intersect at least three of the continuous grooves, and
   wherein the openings penetrate through the polishing pad, while the grooves do not penetrate through the polishing pad.

14. The method of claim 13, wherein the material layer comprises a molding compound.

15. The method of claim 13, wherein at least one of the openings has a stepped sidewall.

16. The method of claim 13, wherein the grooves are distributed uniformly while the openings are distributed locally across the polishing pad.

17. The method of claim 13, wherein the openings are square, rectangular, polygonal, round, elliptical, strip-shaped or cross-shaped in a top view.

18. The method of claim 13, wherein the polishing pad comprises a sub-pad portion and a top pad portion over the sub-pad portion.

19. The method of claim 13, wherein each of the openings of the polishing pad has a substantially vertical sidewall.

20. The method of claim 13, wherein each of the grooves of the polishing pad has a substantially vertical sidewall.

* * * * *